US006842871B2

(12) United States Patent
Piret et al.

(10) Patent No.: US 6,842,871 B2
(45) Date of Patent: Jan. 11, 2005

(54) ENCODING METHOD AND DEVICE, DECODING METHOD AND DEVICE, AND SYSTEMS USING THEM

(75) Inventors: Philippe Piret, Cesson-Sevigne (FR); Claude Le Dantec, Saint Hilaire des Landes (FR)

(73) Assignee: Canon Kabushiki Kaisha, Tokyo (JP)

( * ) Notice: Subject to any disclaimer, the term of this patent is extended or adjusted under 35 U.S.C. 154(b) by 375 days.

(21) Appl. No.: 09/733,965

(22) Filed: Dec. 12, 2000

(65) Prior Publication Data

US 2001/0009030 A1 Jul. 19, 2001

(30) Foreign Application Priority Data

Dec. 20, 1999 (FR) .............................. 9916073

(51) Int. Cl.[7] .............................................. G06F 11/00
(52) U.S. Cl. ..................................... 714/701; 714/790
(58) Field of Search ................................ 714/701, 790, 714/704; 375/240.08, 395, 295; 370/395, 331; 325/42; 371/43, 32

(56) References Cited

U.S. PATENT DOCUMENTS

| | | | | |
|---|---|---|---|---|
| 3,614,622 A | * | 10/1971 | Holsinger | 325/42 |
| 4,394,642 A | | 7/1983 | Currie et al. | 340/347 DD |
| 5,416,787 A | * | 5/1995 | Kodama et al. | 371/43 |
| 5,428,641 A | * | 6/1995 | Long | 375/295 |
| 5,727,002 A | * | 3/1998 | Miller et al. | 371/32 |
| 5,978,365 A | * | 11/1999 | Yi | 370/331 |
| 6,075,789 A | * | 6/2000 | Kasslin et al. | 370/395 |
| 6,148,422 A | * | 11/2000 | Strawczynski et al. | 714/704 |
| 6,233,279 B1 | * | 5/2001 | Boon | 375/240.08 |

FOREIGN PATENT DOCUMENTS

| | | |
|---|---|---|
| EP | 0 928 071 | 7/1999 |
| FR | 2 773 287 | 7/1999 |

OTHER PUBLICATIONS

Joban Hokfelt, et al., "A Survey on Trellis Termination Alternatives for Turbo Codes", IEEE, vol. 3, pp. 2225–2229 (Jul. 3, 1999).

Mark C. Reed, et al., "Turbo–Code Termination Schemes and a Novel Alternative for Short Frames", IEEE, pp. 354–358 (1996).

Claude Berrou, et al., "Near Shannon Limit Error—Correcting Coding and Decoding: Turbo Codes (1)", IEEE, pp. 1064–1070 (May, 23, 1993).

C. Berrou, et al., "Frame–oriented Convolutional Turbo Codes", Electronic Letters, vol. 32, No. 15, pp. 1362–1364 (Jul. 18, 1996).

(List continued on next page.)

Primary Examiner—Albert Decady
Assistant Examiner—Dipakkumar Gandhi
(74) Attorney, Agent, or Firm—Fitzpatrick, Cella, Harper & Scinto

(57) ABSTRACT

In order to encode an original sequence of binary data (u), a first padding operation (508) is performed, supplementing the original sequence (u) so that the supplemented sequence (u) is divisible by a first divisor polynomial; a first recursive convolutional encoding operation (508) is performed, using the first divisor polynomial, encoding the supplemented original sequence (u); an interleaving operation (506) is performed, permuting the binary data in the original sequence (u) by means of a specific permutation, so as to obtain an interleaved sequence (u*); a second padding operation (510) is performed, supplementing the interleaved sequence (u*) so that the supplemented interleaved sequence (u*) is divisible by a second divisor polynomial ($g_2$); and a second recursive convolutional encoding operation (510) is performed, using the second divisor polynomial, encoding the supplemented interleaved sequence (u*).

76 Claims, 8 Drawing Sheets

OTHER PUBLICATIONS

D. Divsalar, et al., "On the Design of Turbo Codes", TDA Progress Report 42–123, pp. 99–121 (Nov. 15, 1995).

Joachim Hagenauer, "Iterative Decoding of Binary Block and Convolutional Codes", IEEE Transactions on Information Theory, vol. 42, No. 2, pp. 429–445 (03/96).

Joachim Hagenauer, et al., "Iterative ("Turbo") Decoding of Systematic Convolutional Codes with the MAP and SOVA Algorithms", pp. 21–29 (Jan. 1, 1994).

Claude Berrou, et al., "Turbo–block–codes", pp. 1–7.

L.R. Bahl, et al., "Optimal Decoding of Linear Codes for Minimizing Symbol Error Rate", IEEE Transactions on Information Theory, pp. 284–287 (03/74).

Joachim Hagenauer, et al., "A Viterbi Algorithm with Soft–Decision Outputs", IEEE, pp. 1680–1686 (1989).

Joachim Hagenauer, "Source–Controlled Channel Decoding", IEEE Transactions on Communications, vol. 43, No. 9, pp. 2449–2457 (09/95).

* cited by examiner

ENCODING METHOD AND DEVICE, DECODING METHOD AND DEVICE, AND SYSTEMS USING THEM

The present invention relates to an encoding method and device, a decoding method and device, and systems using them.

In general terms, the present invention implements a specific use of binary elements (bits) referred to as padding bits in convolutional parallel turbocodes with interleavers preserving divisibility.

Conventionally, a turbo-encoder consists of three essential parts: two elementary systematic recursive convolutional encoders and one interleaver.

The associated decoder consists of the two elementary decoders with so-called soft inputs and outputs corresponding to the convolutional encoders, an interleaver and its reverse interleaver (also referred to as a "deinterleaver").

A description of turbocodes will be found in the article *"Near Shannon limit error-correcting coding and decoding: turbo codes"* corresponding to the presentation given by C. Berrou, A. Glavieux and P. Thitimajshima during the ICC conference in Geneva in May 1993.

Since the encoders are systematic recursive encoders, the problem which is often found is the one of the return to zero of the encoders.

In the prior art various ways of dealing with this problem are found, notably:

1. Absence of return to zero: the encoders are initialised to the null state and they are left to move towards any state without intervening.
2. Return to zero of the first encoder: the encoders are initialized to the null state and padding bits are added in order to impose a null final state solely on the first encoder.
3. "Frame Oriented Convolutional Turbo Codes" (FOCTC): the first encoder is initialised and the final state of the first encoder is taken as the initial state of the second encoder. When a class of interleavers having certain properties is used, the final state of the second encoder is null. In this regard reference can usefully be made to the article by C. Berrou and M. Jézéquel entitled *"Frame oriented convolutional turbo-codes"*, in Electronics Letters, Vol. 32, No. 15, Jul. 18, 1996, pages 1362 to 1364, Stevenage, Herts, Great Britain.
4. Independent return to zero of the two encoders: the encoders are initialised to the null state and padding bits are added independently to each of the sequences entering the encoders. A general description of independent return to zero of encoders is given in the report by D. Divsalar and F. Pollara entitled *"TDA progress report 42-123 On the design of turbo codes"*, published in November 1995 by JPL (Jet Propulsion Laboratory).
5. Intrinsic return to zero of the two encoders: the encoders are initialised to the null state and padding bits are added to the sequence entering the first encoder. When use is made of an interleaver guaranteeing return to zero as disclosed in the patent document FR-A-2 773 287 and the sequence comprising the padding bits is interleaved, the second encoder automatically has a final null state.

For each of the solutions of the prior art mentioned above, there exists an adapted trellis termination applying to the corresponding decoders. These decoders take into account the termination or not of the trellis, as well as the fact that, where applicable, each of the two encoders uses the same padding bits.

Solutions 1 and 2 generally offer less good performance than solutions 3 to 5.

However, solutions 3 to 5 also have drawbacks.

Solution 3 limits the choice of interleavers, which may reduce the performance or unnecessarily complicate the design of the interleaver.

When the size of the interleaver is small, solution 4 has less good performance than solution 5.

As for solution 5, it requires the determination of the padding bits before the second encoder can commence encoding.

Thus the prior art does not resolve the problem consisting:
- during encoding, of resetting the encoders to zero, and
- during decoding, terminating the trellises used in the decoders,
- whilst keeping good performance even if the size of the interleaver is small, and
- whilst enabling the second encoder to commence encoding before the first encoder has determined the padding bits.

Moreover, in certain cases, it may be wished to use different types of interleavers according to the size of the blocks which it is wished to encode, whilst keeping a compatible turbo-encoder or turbodecoder architecture with independent trellis terminations and having good performance overall, notably for small block sizes.

The purpose of the present invention is to remedy the aforementioned drawbacks.

For this purpose, the present invention proposes a method for encoding at least one sequence of original binary data, according to which:
- at least one first padding operation is performed, consisting of supplementing the original sequence with a first sequence of padding binary data chosen so that the original sequence, supplemented by the first padding sequence, is divisible by a first divisor polynomial;
- at least one first recursive convolutional encoding operation is performed, consisting of encoding the original sequence, supplemented by the first padding sequence, by means of an encoding technique using the first divisor polynomial;
- at least one interleaving operation is performed, consisting of permuting the binary data of the original sequence by means of a specific permutation, so as to obtain an interleaved sequence;

this encoding method being remarkable in that:
- the specific permutation is, in a representation where the binary data of the original sequence are written and read, row by row, in an array with N0 columns and M rows, where N0 is the smallest integer such that the first divisor polynomial divides the polynomial $x^{N0}+1$ and M is a positive integer, the resultant:
  - of an intercolumn permutation which transforms the cyclic code of length N0 whose generator polynomial is the first divisor polynomial into a cyclic code whose generator polynomial is a second divisor polynomial, the intercolumn permutation permuting with each other the N0 columns of the array representing the original sequence, and
  - any number of intracolumn elementary permutations, each of these elementary permutations being any permutation of the symbols in a column of the aforementioned array; and in that:
- at least one second padding operation is performed, consisting of supplementing the interleaved sequence with a second sequence of padding binary data, chosen so that the interleaved sequence, supplemented by the second padding sequence, is divisible by the second divisor polynomial; and at least one second recursive convolutional encoding operation is performed, consisting of encoding the interleaved sequence, supplemented by the second padding sequence, by means of an encoding technique using the second divisor polynomial.

Thus, for a given block size:

the two encoders are initialised to a null state;

for the input sequence use is made solely of an interleaver preserving the divisibility by the divisor polynomials of the two encoders; and padding bits are added independently to each of the sequences in order to reset to zero each of the encoders.

Thus good performance on decoding is obtained. This makes it possible notably to use, during decoding, the relationships existing between the padding bits.

According to a particular characteristic, the binary data of the second padding sequence are determined solely from knowledge of the binary data of the first padding sequence.

This characteristic enables to simplify the encoding.

In a first embodiment, it is possible to determine the binary data of the second padding sequence from a previously established conversion table giving the second padding sequence as a function of the first padding sequence.

This enables to simplify the encoding.

In a second embodiment, it is possible to determine the binary data of the second padding sequence instantly as a function of the binary data of the first padding sequence.

This confers great flexibility of use on the invention.

According to a particular characteristic, in order to construct the second padding sequence from the first padding sequence having a number of data equal to the degree of the first divisor polynomial:

the first padding sequence is supplemented with zeros, so as to obtain a sequence with a length equal to N0;

the binary data in the first padding sequence are permuted by means of the intercolumn permutation, so as to obtain a first interleaved padding sequence;

the residue of the polynomial division of the first interleaved padding sequence by the second divisor polynomial is determined; and the aforementioned residue is chosen as the second padding sequence.

This method makes it possible to instantly calculate the second padding sequence as a function of the first padding sequence. This also makes it possible to construct a conversion table in advance as a function of the first padding sequence. This can also be used in a decoding method in order to establish systems of equations connecting the padding bits.

According to a particular characteristic, the first divisor polynomial and the second divisor polynomial are identical.

This enables to simplify the encoding.

According to a particular characteristic, when the intercolumn permutation is the identity permutation, the second padding sequence is determined as being equal to the first padding sequence.

This enables to simplify the encoding.

In a particular embodiment, at least one of the padding sequences is punctured.

This makes it possible to increase the code efficiency, with a very low loss of performance.

Advantageously, at least one of the padding sequences is punctured so that the coded sequence includes part of the first and second padding sequences which remains representative of all the first and second padding sequences.

This characteristic makes it possible to keep good performances.

According to a particular characteristic, the first padding sequence is fully punctured.

According to one particular characteristic, the second padding sequence is fully punctured.

The above two characteristics have the advantage of having great simplicity.

For the same purpose as before, the present invention also proposes a device for encoding at least one sequence of original binary data, having:

at least one first padding module, for supplementing the original sequence with a first sequence of padding binary data chosen so that the original sequence, supplemented by the first padding sequence, is divisible by a first divisor polynomial;

at least one first recursive convolutional encoding module, for encoding the original sequence, supplemented by the first padding sequence, by means of an encoding technique using the first divisor polynomial;

at least one first interleaving module, for permuting the binary data in the original sequence by means of a specific permutation, so as to obtain an interleaved sequence;

this encoding device being remarkable in that:

the specific permutation is, in a representation where the binary data in the original sequence are written and read, row by row, in an array with N0 columns and M rows, where N0 is the smallest integer such that the first divisor polynomial divides the polynomial $x^{N0}+1$ and M is a positive integer, the resultant:

of an intercolumn permutation which transforms the cyclic code of length N0 whose generator polynomial is the first divisor polynomial into a cyclic code whose generator polynomial is a second divisor polynomial, the intercolumn permutation permuting with each other the N0 columns of the array representing the original sequence, and any number of intracolumn elementary permutations, each of these elementary permutations being any permutation of the symbols in a column of the aforementioned array; and in that the device also has:

at least one second padding module, for supplementing the interleaved sequence with a second sequence of padding binary data, chosen so that the interleaved sequence, supplemented by the second padding sequence, is divisible by the second divisor polynomial; and at least one second recursive convolutional encoding module, for encoding the interleaved sequence, supplemented by the second padding sequence, by means of an encoding technique using the second divisor polynomial.

The particular characteristics and the advantages of the encoding device being the same as those of the encoding method according to the invention, they are not repeated here.

Still for the same purpose, the present invention also proposes a method of decoding at least one original symbol sequence, remarkable in that the original symbol sequence represents a binary sequence encoded by means of an encoding method such as the one above.

Thus a turbodecoder similar to a turbodecoder adapted to deal with encoders with independent return to zero, but using the general relationships between the two padding sequences, in order to obtain, at each iteration, a priori information on each of these two sequences, is considered.

According to a particular characteristic, the decoding method uses decoding operations with soft inputs and soft outputs.

The above decoding method has the general advantages peculiar to the turbodecoding methods with a code offering good performance.

According to a particular characteristic, there is effected iteratively:

at least one first elementary operation of decoding a recursive convolutional code, consisting of decoding a first sub-sequence of the original symbol sequence by means of a decoding technique using the first divisor polynomial and taking at least into account a first sequence of binary data which is a function of the first and second padding sequences.

According to a particular characteristic, the first sequence of binary data is determined using a previously established equation system giving the first sequence of binary data as a function of the first and second padding sequences.

By virtue of the above characteristics, the padding bits participate fully in the iterative decoding process. They are also well protected, or even better protected, than the other bits. Thus the performance of the turbodecoding is improved.

In a variant, the first sequence of binary data is determined using a system of equations established instantly and giving the first sequence of binary data as a function of the first and second padding sequences.

This variant confers simplicity and speed on the decoding.

According to a particular characteristic, there is also effected iteratively:

at least one second elementary operation of decoding a recursive convolutional code, consisting of decoding a second sub-sequence of the original symbol sequence by means of a decoding technique using the second divisor polynomial and taking at least into account a second sequence of binary data which is a function of the first and second padding sequences.

According to a particular characteristic, the second sequence of binary data is determined using a system of previously established equations giving the second sequence of binary data as a function of the first and second padding sequences.

As a variant, the second binary data sequence is determined using a system of equations established instantly and giving the second sequence of binary data as a function of the first and second padding sequences.

According to a particular characteristic, there is also effected iteratively:

at least one operation of interleaving a sequence representing the original sequence; and:

during the first elementary decoding operation, at least one first extrinsic information sequence is determined, and in parallel to the interleaving operation, a first calculation operation is effected, consisting of calculating a first a priori information sequence as a function of the first extrinsic information sequence, the first a priori information sequence being taken into account during the second elementary decoding operation.

The above characteristics have the same advantages as those mentioned in relation to the first elementary decoding operation and the determination of the first sequence of binary data.

According to a particular characteristic, the first a priori information sequence is determined using a system of previously established equations giving the first a priori information sequence as a function of the first extrinsic information sequence.

As a variant, the first a priori information sequence is determined using a system of equations established instantly and giving the first a priori information sequence as a function of the first extrinsic information system.

According to a particular characteristic, there is also effected iteratively:

at least one operation of deinterleaving a sequence representing the interleaved original sequence; and:

during the second elementary decoding operation, at least one second extrinsic information sequence is determined, and in parallel to the deinterleaving operation, a second calculation operation is performed, consisting of calculating a second a priori information sequence as a function of the second extrinsic information sequence, the second a priori information sequence being taken into account during the first elementary decoding operation.

According to a particular characteristic, the second a priori information sequence is determined using a system of previously established equations giving the second a priori information sequence as a function of the second extrinsic information sequence.

As a variant, the second a priori information sequence is determined using a system of equations established instantly and giving the second a priori information sequence as a function of the second extrinsic information sequence.

According to a particular characteristic, the first padding sequence having been fully punctured at the time of encoding, the second binary data sequence taken into account during the second elementary decoding operation is identical to the second padding sequence.

According to a particular characteristic, the second padding sequence having been fully punctured at the time of encoding, the first binary data sequence taken into account during the first elementary decoding operation is identical to the first padding sequence.

For the same purpose as before, the present invention also proposes a device for decoding at least one original symbol sequence, remarkable in that the original symbol sequence represents a binary sequence encoded by means of an encoding device such as the one above.

The particular characteristics and the advantages of the decoding device being the same as those of the decoding method according to the invention, they are not repeated here.

The present invention also relates to a digital signal processing apparatus, having means adapted to implement an encoding method and/or a decoding method such as the ones above.

The present invention also relates to a digital signal processing apparatus, having an encoding device and/or a decoding device such as the ones above.

The present invention also relates to a telecommunications network, having means adapted to implement an encoding method and/or a decoding method such as the ones above.

The present invention also relates to a telecommunications network, having an encoding device and/or a decoding device such as the ones above.

The present invention also relates to a mobile station in a telecommunications network, having means adapted to implement an encoding method and/or a decoding method such as the ones above.

The present invention also relates to a mobile station in a telecommunications network, having an encoding device and/or a decoding device such as the ones above.

The present invention also relates to a device for processing signals representing speech, having an encoding device and/or a decoding device such as the ones above.

The present invention also relates to a data transmission device having a transmitter adapted to implement a packet transmission protocol, having an encoding device and/or a decoding device and/or a device for processing signals representing speech such as the ones above.

According to a particular characteristic of the data transmission device, the packet transmission protocol is of the ATM ("Asynchronous Transfer Mode") type.

As a variant, the packet transmission protocol is of the IP (transmission protocol used on the Internet, "Internet Protocol") type.

The invention also relates to:

an information storage means which can be read by a computer or a microprocessor storing instructions of a computer program, for implementing the encoding method and/or the decoding method of the invention such as the ones above, and an information storage means which is removable, partially or totally, which can be read by a computer or microprocessor storing instructions of a computer program, allowing the implementation of the encoding method and/or the decoding method of the invention such as the ones above.

The invention also relates to a computer program containing instruction sequences for implementing an encoding and/or decoding method such as the ones above.

The particular characteristics and the advantages of the different digital signal processing apparatus, the different telecommunications networks, the different mobile stations, the device for processing signals representing speech, the data transmission device, the information storage means and the computer program being the same as those of the encoding and decoding methods and devices according to the invention, they are not repeated here.

Other aspects and advantages of the invention will emerge from a reading of the following detailed description of particular embodiments, given by way of non-limitative examples. The description refers to the drawings which accompany it, in which.

Figure 1:
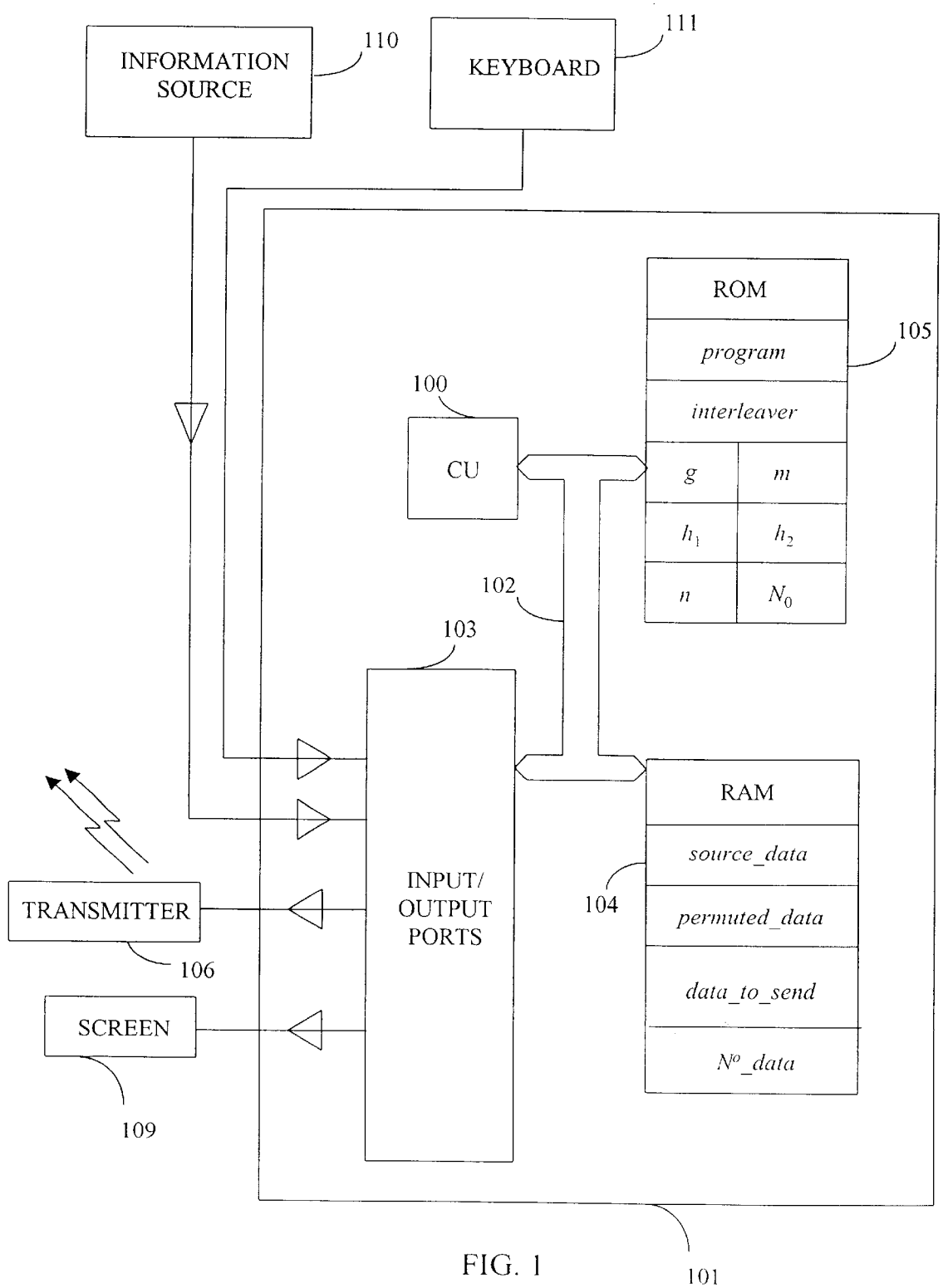
FIG. 1 depicts schematically an electronic device including an encoding device according to the present invention, in a particular embodiment.

In general terms, a turbo-encoder of the type appearing in the invention, having an efficiency of ⅓, can be considered to be a pair of convolutional recursive encoders using divisor polynomials. The first encoder produces a check sequence using a sequence of symbols to be coded u and the second encoder produces a check sequence from an interleaved sequence u* obtained by interleaving the sequence u.

Let $g_1(x)$ be the divisor polynomial of the first encoder.

Let m be the degree of the polynomial $g_1(x)$ and N0 the smallest integer such that $g_1(x)$ is a divisor of the polynomial $x^{N0}+1$. This number N0 is referred to as the "period" of $g_1(x)$.

Let $g_2(x)$ be the divisor polynomial of the second encoder. $g_1(x)$ and $g_2(x)$ have the following property: if $$g_1(x) = \prod_i (x - x_i)$$

is the complete factorisation of $g_1(x)$ in an extension field of the two-element field, then the complete factorisation of $$g_2(x) \text{ is } \prod_i (x - x_i^\varphi)$$

where φ is an automorphism (denoted exponentially) of said extension field. Hereinafter, such a polynomial $g_2(x)$ will be said to be compatible with $g_1(x)$. In particular, a polynomial is always compatible with itself. It will be noted that two compatible polynomials have the same degree and the same period.

Consider for example the factorisation $g_1(x)=(x-\alpha)(x-\alpha^2)(x-\alpha^4)$ of $g_1(x)=x^3+x+1$ where α is a seventh primitive root of the unit and belongs to the field containing eight elements. Consider the six automorphisms $\phi_i: \alpha \to \alpha^i$ of this eight-element field. It is verified that $\phi_1$, $\phi_2$ and $\phi_4$ produce $g_2(x)=g_1(x)$ whilst $\phi_3$, $\phi_6$ and $\phi_5$ produce $g_2(x)=x^3+x^2+1$, which is factorised as $g_2(x)=(x-\alpha^3)(x-\alpha^6)(x-\alpha^5)$.

Hereinafter, it is assumed that $g_1(x)=g_2(x)$. By convention, $g_1(x)$ and $g_2(x)$ will be denoted g(x).

Let n be a multiple of N0: n=M.N0, M being an integer.

The first encoder produces padding bits guaranteeing its return to zero and a check sequence from a sequence of binary information symbols to be coded u of length n.

The sequence of symbols u has a polynomial representation u(x), of degree n−1, with binary coefficients.

Thus the first encoder encodes a sequence $$a_1(x) = u(x) + \sum_{i=0}^{m-1} p_{1i} x^{i+n}$$

as a sequence $v_1(x)=a_1(x).h_1(x)/g(x)$ where:

$h_1(x)$ and g(x) are two polynomials prime with each other, and the m binary symbols $p_{1i}$ (padding bits) are chosen so that $a_1(x)$ is a multiple of g(x).

In addition, the sequence u(x) is interleaved in a sequence u*(x) by means of a permutation preserving the divisibility by g(x).

These permutations are, in a representation where the binary data of the sequence u are written and read, row by row, in an array with N0 columns and M rows, N0 being the smallest integer such that the divisor polynomial g(x) divides $x^{N0}+1$, the resultant:

of an intercolumn permutation, automorphism of the cyclic code of length N0 and generator polynomial g(x), which acts by permutation on the N0 columns in the array representing $a_i$, and any number of intracolumn elementary permutations, each of these permutations being any permutation of the symbols in a column in said array.

The second encoder encodes a sequence $$a_2(x) = u^*(x) + \sum_{i=0}^{m-1} p_{2i} x^{i+n}$$

as a sequence $v_2(x)=a_2(x).h_2(x)/g(x)$ where:

$h_2(x)$ and g(x) are two polynomials prime with each other, and the m binary symbols $p_{2i}$ (padding bits) are chosen so that $a_2(x)$ is a multiple of g(x).

Overall, the turbo-encoder produces the sequences $$u, \underline{p}_1\left(=\sum_{i=0}^{m-1} p_{1i}x^i\right), \underline{p}_2\left(=\sum_{i=0}^{m-1} p_{2i}x^i\right),$$

$v_1$ and $v_2$ which will be transmitted over a channel.

It is then noted that the padding bits are connected together by a linear equation which depends only on the interleaver and, more precisely, only on the resultant permutation which permutes the N0 columns in the array describing this interleaver.

By way of illustration, a divisor polynomial g(x) equal to $1+x^2+x^3$ is considered below. Its period, N0, is equal to 7.

A sequence to be encoded of 147 bits (n=147) and polynomials $h_1(x)$ and $h_2(x)$ both equal to $1+x+x^3$, are considered.

As a variant, it is possibly to partly puncture the padding sequences, since there exist linear relationships between the two padding sequences.

Under these conditions, an interleaver preserving divisibility by g(x) must have a size which is a multiple of 7; if the data are written row by row in a 7-column array, it is possible to permute these data within each column in any manner and to permute the columns with each other according to certain conditions preserving divisibility by g(x), before reading the permuted data row by row.

Numbering the columns in an increasing order from 0 to 6, the permutation which causes the column of rank $b_0$ to pass to rank $b_1$, the column of rank $b_1$ to rank $b_2$, ... and the column of rank $b_k$ to rank $b_0$, is denoted $(b_0, b_1, \ldots, b_k)$.

The composite of two permutations $(c_0, c_1, \ldots, c_k)$ and $(d_0, d_1, \ldots, d_{k'})$ is denoted $(c_0, c_1, \ldots, c_k)(d_0, d_1, \ldots, d_{k'})$.

Table T which follows gives a list of the 168 intercolumn permutations which preserve divisibility by g(x).

TABLE T

| Identity | (1 2 4) (3 6 5) | (1 4 2) (3 5 6) |
|---|---|---|
| (0 1 2 3 4 5 6) | (0 2 6) (1 4 3) | (0 4 6) (3 2 5) |
| (0 2 4 6 1 3 5) | (0 4 5) (1 6 2) | (0 1 5) (3 6 4) |
| (0 3 6 2 5 1 4) | (0 6 4) (2 3 5) | (0 5 4) (1 2 6) |

TABLE T-continued

| | | |
|---|---|---|
| (0 4 1 5 2 6 3) | (0 1 3) (2 5 4) | (0 2 3) (1 6 5) |
| (0 5 3 1 6 4 2) | (0 3 2) (1 5 6) | (0 6 2) (1 3 4) |
| (0 6 5 4 3 2 1) | (0 5 1) (3 4 6) | (0 3 1) (2 4 5) |
| (1 5) (2 3) | (1 3 6) (2 4 5) | (1 4 3) (2 5 6) |
| (0 5 6) (1 3 4) | (0 3 5 1 4 2 6) | (0 4 6) (2 1 5) |
| (0 3 1 2 4 6 5) | (0 4 1 6 3 2 5) | (0 5) (2 3 6 4) |
| (0 2 1 4) (3 6) | (0 6 4) (3 1 5) | (0 1 3 2 6 5 4) |
| (0 4 5 3) (2 6) | (0 5 4 3) (1 2) | (0 3) (1 6) |
| (0 1 6 4 3 5 2) | (0 2) (5 6) | (0 6 3 4 5 1 2) |
| (0 6 1) (2 5 4) | (0 1) (2 3 4 6) | (0 2 4 1) (3 5) |
| (2 3) (4 6) | (1 3 4) (2 6 5) | (1 6 2) (3 5 4) |
| (0 1 3 6) (4 5) | (0 3 1 6) (2 4) | (0 6) (2 5) |
| (0 3 5) (1 2 6) | (0 6 3 2 1 4 5) | (0 1 5) (2 3 4) |
| (0 2 5 1 6 3 4) | (0 4) (5 3) | (0 5 6 1 3 2 4) |
| (0 6 2 4 1 5 3) | (0 1 2 5 6 4 3) | (0 3) (1 4 6 5) |
| (0 5 2) (1 4 3) | (0 2) (1 5 4 6) | (0 4 1 2) (3 6) |
| (0 4 2 1) (5 6) | (0 5 1) (3 6 2) | (0 2 6 4 5 3 1) |
| (1 5) (4 6) | (1 2 6) (3 4 5) | (1 6 3) (2 5 4) |
| (0 5 4 1 2 3 6) | (0 2 4 3 5 1 6) | (0 6) (1 5 3 2) |
| (0 2 6 5) (1 3) | (0 6 2 5) (1 4) | (0 5) (3 4) |
| (0 3 4) (1 6 2) | (0 4) (1 5 2 3) | (0 1 2 4) (5 6) |
| (0 6 3) (2 4 5) | (0 5 6 4 2 1 3) | (0 2 3) (1 4 6) |
| (0 1 4 2) (3 5) | (0 3 2) (4 6 5) | (0 4 5 1 3 6 2) |
| (0 4 3 2 5 6 1) | (0 1) (3 6) | (0 3 5 2 6 4 1) |
| (2 4) (3 6) | (1 4) (5 6) | (1 2) (3 5) |
| (0 1 4 5 3 2 6) | (0 4 6) (1 2 3) | (0 2 5 6) (3 4) |
| (0 4 3 5) (1 6) | (0 2 1 3 6 4 5) | (0 1 5) (6 2 4) |
| (0 6 4) (1 2 5) | (0 3 5 4) (2 6) | (0 5 2 3 6 1 4) |
| (0 2 3) (1 5 4) | (0 1 6 3) (2 5) | (0 4 2 6 5 1 3) |
| (0 5 6 2) (1 3) | (0 6 1 5 3 4 2) | (0 3 2) (1 6 4) |
| (0 3 4 6 5 2 1) | (0 5 1) (3 2 4) | (0 6 3 1) (4 5) |
| (1 5) (2 4 3 6) | (1 4 5 6) (2 3) | (1 3) (2 5) |
| (0 5 2 6) (1 4) | (0 4 6) (1 3 5) | (0 3 4 2 1 5 6) |
| (0 4 2 3 1 6 5) | (0 3 6 4 1 2 5) | (0 5) (2 4 6 3) |
| (0 6 4) (1 3 2) | (0 2 6 3 1 5 4) | (0 1 4) (3 6 5) |
| (0 3) (4 5) | (0 5 3) (1 6 2) | (0 4 3) (1 2 6) |
| (0 1 2) (3 5 6) | (0 6 5 2) (3 4) | (0 2) (1 6 4 5) |
| (0 2 5 3 4 6 1) | (0 1) (2 4) | (0 6 2 3 5 4 1) |
| (2 6) (3 4) | (1 6 5 4) (2 3) | (1 3 5 2) (4 6) |
| (0 1 3) (2 4 5) | (0 6) (1 3) | (0 3 6) (2 5 4) |
| (0 6 1 4 2 3 5) | (0 3 4 5) (1 2) | (0 1 5) (2 6 3) |
| (0 4) (1 3 2 5) | (0 2 4) (3 5 6) | (0 5 3 4) (1 6) |
| (0 3) (1 5 6 4) | (0 1 4 6 2 5 3) | (0 6 5 1 2 4 3) |
| (0 5 4 6 3 1 2) | (0 4 3 6 1 5 2) | (0 2) (1 4) |
| (0 2 1) (2 6 4) | (0 5 1) (2 6 4) | (0 4 5 6 2 3 1) |
| (1 5) (2 6 3 4) | (1 6) (4 5) | (1 2 5 3) (4 6) |
| (0 5 3 2 4 1 6) | (0 6) (1 2 3 5) | (0 2 1 5 4 3 6) |
| (0 6 5) (1 4 3) | (0 2 5) (1 3 4) | (0 5) (2 6) |
| (0 4) (1 2) | (0 3 1 5 6 2 4) | (0 1 6 5 2 3 4) |
| (0 2 3) (4 5 6) | (0 5 2 1 4 6 3) | (0 6 1 3) (2 4) |
| (0 1 3 5 4 6 2) | (0 4 2) (3 6 5) | (0 3 2) (1 4 5) |
| (0 3 6 1) (2 5) | (0 1) (2 6 4 3) | (0 4 1) (3 5 6) |

A simple-to-use interleaver is for example an "x to $x^{32}$" interleaver defined as follows: if u designates the input sequence and u* the permuted sequence, this interleaver permutes each bit in position i in u to a position (32.i modulo 147) in u*.

This interleaver can be obtained by means of the composite: (i) of the intercolumn permutation Π=(1 4 2)(3 5 6), which appears in the table of intercolumn permutations given above and (ii) intracolumn permutations. Thus this interleaver preserves divisibility by g, whilst remaining simple to use.

In general terms, it is possible to use interleavers of the form "x to $x^e$", where e is a power of 2 modulo n.

These interleavers are defined as follows:

if u designates the input sequence and u* the permuted sequence, the interleaver permutes each bit which is situated initially at position i in u, to a position (e.i modulo n) in u*.

To each sequence to be encoded u and u*, 3 padding bits are added so that the concatenation of each sequence to be encoded with its associated sequence of 3 padding bits guarantees a return to zero of each of the encoders encoding each sequence thus obtained.

The padding sequence added to the sequence u by the first encoder is denoted $p_1=(p_{10}, p_{11}, p_{12})$, the padding sequence added to the sequence u* by the second encoder is denoted $p_2=(p_{20}, p_{21}, p_{22})$, the parity sequence issuing from the first encoder is denoted $v_1$, and the parity sequence issuing from the second encoder is denoted $v_2$.

The sequence $(u, v_1, v_2, p_1, p_2)$ is transmitted.

A description will be given now of the relationship existing between the padding bits.

$a_1(x)$ is equal to $u(x)+p_1(x).x^n$ and is divisible by $g(x)$.

A permutation which transforms the sequence $a_1(x)$ into a sequence $a_1'(x)$ equal to $u^*(x)+p''_1(x).x^n$ is considered.

Consider the intercolumn permutation $\Pi=(1\ 4\ 2)(3\ 5\ 6)$ used to define the global permutation which permutes the sequence u into a sequence u* and which, here, acts on sequences of 7 bits.

The sequence $p''_1$ is obtained by the permutation $\Pi$ of a sequence $p_1$ extended to 7 bits equal to $[p_{10}\ p_{11}\ p_{12}\ 0\ 0\ 0\ 0]$.

Thus $p''_1(x)=p_{10}+p_{11}.x^4+p_{12}.x=p_{10}+p_{12}.x+p_{11}.x^4$.

By construction, the permutation $\Pi$ is a permutation preserving divisibility by $g(x)$. Thus $a_1'(x)$ is divisible by $g(x)$.

The residue of $p''_1$ modulo $g(x)$ is equal to $p''(X)=(p_{10}+p_{11})+(p_{11}+p_{12}).x+p_{11}.x^2$.

Consequently, the sequence $a''(x)$ equalling $u^*(x)+p''(x).x^n$ is also divisible by $g(x)$.

In addition, $a_2(x)$ is equal to $u^*(x)+p_2(x).x^n$ and is divisible by $g(x)$.

As g is of the $3^{rd}$ degree and p'' and $p_2$ are of the $2^{nd}$ degree, p'' and $p_2$ are equal.

There are deduced therefrom the following relationships between $p_1$ and $p_2$ which depend only on the permutations of columns of the interleaver guaranteeing return to zero of the encoder, that is to say here $\Pi=(1\ 4\ 2)(3\ 5\ 6)$:

$$p_{20}=p_{10}+p_{11}$$

$$p_{21}=p_{11}+p_{12}$$

$$p_{22}=p_{11}$$

This system of equations is reversible: it is also easy to find $p_1$ as a function of $p_2$.

This way of proceeding is applicable whatever the permutation acting on the columns preserving divisibility by g. The obtaining of the equations linking the padding bits can be generalised:

first of all by supplementing the first padding sequence $p_1$ with zeros in order to obtain a sequence with a length equal to the period of the feedback polynomial $g(x)$, then determining the sequence $p_1''$ obtained by interleaving the padding sequence $p_1$ with the resultant permutation acting on the columns which was defined in order to transform u into u*, and finally calculating the residue of $p_1''$ modulo g.

In the particular case where the intercolumn permutation is identity, the sequences $p_1$ and $p_2$ are identical.

As a variant, the padding sequences are punctured by transmitting the sequence $(u, v_1, v_2, pp)$ where pp includes padding bits of $p_1$ and $p_2$ and, advantageously, a combination linearly independent of the bits of $p_1$ and $p_2$, or, in more general terms, a part of the first and second padding sequences $p_1$ and $p_2$ which remains representative of these two sequences, that is to say which makes it possible to find the two sequences in their entirety.

Preferably either the first sequence of padding bits $p_1$ is punctured in its entirety, or the second sequence of padding bits $p_2$ in its entirety.

A turbodecoder is now described in general terms.

Turbodecoding is an iterative operation well known to persons skilled in the art. For more details, reference can useful be made to:

the article by J. Hagenauer, E. Offer and L. Papke entitled "*Iterative decoding of binary block and convolutional codes*", in IEEE Transactions on Information Theory, March 1996;

the article by J. Hagenauer, P. Robertson and L. Papke entitled "*Iterative (turbo) decoding of systematic convolutional codes with the MAP and SOVA algorithms*", in Informationstechnische Gesellschaft (ITG) Fachbericht, pages 21 to 29, October 1994, and the article by C. Berrou, S. Evano and G. Battail, entitled "*Turbo-block-codes*", published with the proceedings of the seminar "*Turbocoding*" organised by the Technology Institute of Lund (Sweden) (Department of Applied Electronics) in August 1996.

Nevertheless, in the state of the art, there are no particular relationships which link the padding bits. Here, to optimise the decoding quality, the turbodecoder will use the system of equations which link $p_1$ and $p_2$ both with regard to the corresponding elementary decoders where a priori information on $p_1$ and $p_2$ will be available and with regard to their output, where extrinsic information on $p_1$ and $p_2$ will be supplied.

A description will now be given of a particular embodiment of the present invention, with the help of FIGS. 1 to 8.

FIG. 1 illustrates schematically the constitution of a network station or computer coding station, in the form of a block diagram.

This station has a keyboard 111, a screen 109, an external information source 110, a radio transmitter 106, conjointly connected to an input/output port 103 of a processing card 101.

The processing card 101 has, connected together by an address and data bus 102:

a central processing unit 100;

a random access memory RAM 104;

a read only memory ROM 105; and the input/output port 103.

Each of the elements illustrated in FIG. 1 is well known to persons skilled in the art of microcomputers and transmission systems and, more generally, information processing systems. These common elements are therefore not described here. It should be noted, however, that:

the information source 110 is, for example, an interface peripheral, a sensor, a demodulator, an external memory or another information processing system (not shown), and is advantageously adapted to supply sequences of signals representing speech, service messages or multimedia data, in the form of sequences of binary data, and that the radio transmitter 106 is adapted to implement a packet transmission protocol on a wireless channel, and to transmit these packets over such a channel.

It will also be observed that the word "register" used in the description designates, in each of the memories 104 and 105, both a memory area of low capacity (a few binary data) and a memory area of large capacity (making it possible to store an entire program).

The random access memory 104 stores data, variables and intermediate processing results, in memory registers bearing, in the description, the same names as the data whose values they store. The random access memory 104 contains notably:

a register "source_data", in which there are stored, in the order of their arrival on the bus 102, the binary data coming from the information source 110, in the form of a sequence u, a register "N°_data", which stores an integer number corresponding to the number of binary data in the register "source_data", a register "permuted_data", in which there are stored, in the order of their arrival on the bus 102, the permuted binary data, described below with the help of FIG. 5, in the form of a sequence u*, and a register "data_to_send", in which there are stored the sequences to be transmitted.

The read only memory 105 is adapted to store, in registers which, for convenience, have the same names as the data which they store:

the operating program of the central processing unit 100, in a register "program", the sequence g, in a register "g", the degree m of g(x), in a register "m", the sequence $h_1$, in a register "$h_1$", the sequence $h_2$, in a register "$h_2$", the value of N0, in a register "N0", the value of n, in a register "n", and the array defining the interleaver, in a register "interleaver".

The data in ROM 105 can be provided by a removable storage medium, such as, for example, a floppy disk, a CD-ROM or a DVD.

Figure 5:
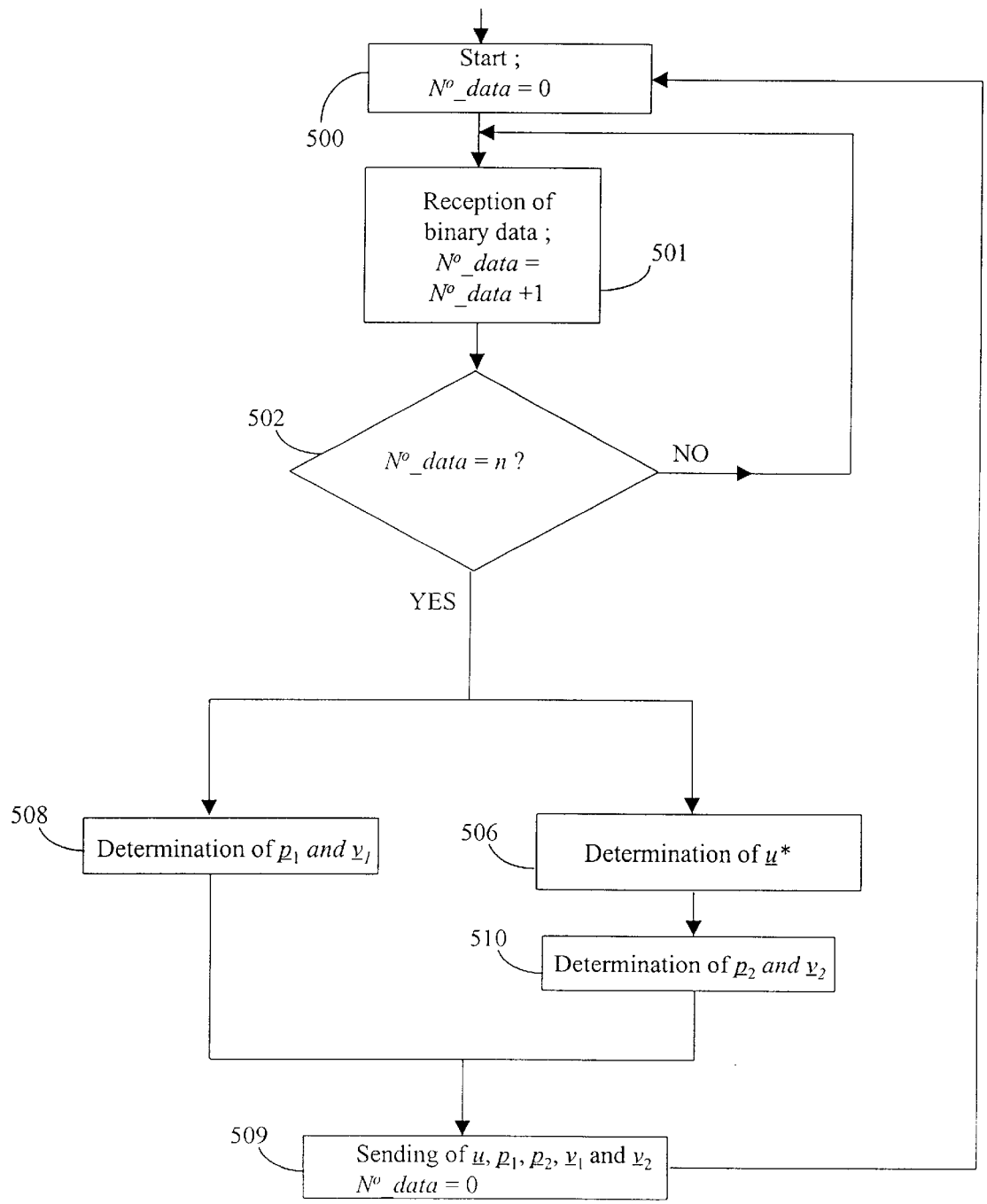
FIG. 5 is a flow diagram depicting schematically the functioning of an encoding device such as the one included in the electronic device of FIG. 1, in a particular embodiment.

The central processing unit 100 is adapted to implement the flow diagram illustrated in FIG. 5.

Figure 2:
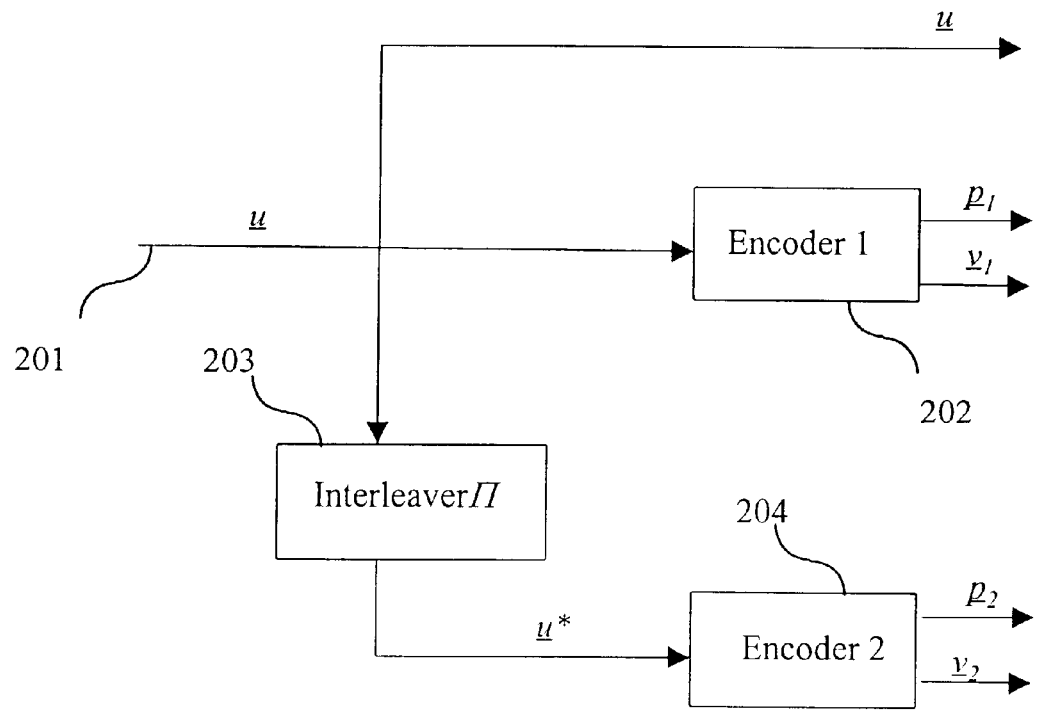
FIG. 2 depicts schematically, in the form of a block diagram, an encoding device corresponding to a parallel convolutional turbocode, according to the present invention, in a particular embodiment.

It can be seen, in FIG. 2, that an encoding device corresponding to a parallel convolutional turbocode according to the present invention has notably:

an input for symbols to be encoded 201, where the information source 110 supplies a sequence of binary symbols to be transmitted, or "to be encoded", u, a first encoder 202 which supplies, from the sequence u, two sequences $p_1$ and v of symbols representing the sequence u, an interleaver 203 which supplies, from the sequence u, an interleaved sequence u*, whose symbols are the symbols of the sequence u, but in a different order, and a second encoder 204 which supplies, from the interleaved sequence u* two sequences $p_2$ and $v_2$ of symbols representing the sequence u*.

In a variant, the sequence $p_2$ can be determined solely from the knowledge of the sequence $p_1$, either by means of a calculation using the intercolumn permutation Π, as described above, or, preferably, using a conversion table giving $p_2$ as a function of $p_1$, this conversion table having previously been established.

The five sequences u, $v_1$, $v_2$, $p_1$ and $p_2$ are transmitted in order next to be decoded.

In the remainder of the description, the concern is preferably with interleavers of the "x to $x^{32}$" type of size 147, although the present invention is not limited to this type of interleaver, but concerns, much more generally, all interleavers preserving divisibility by g(x).

Figure 3:
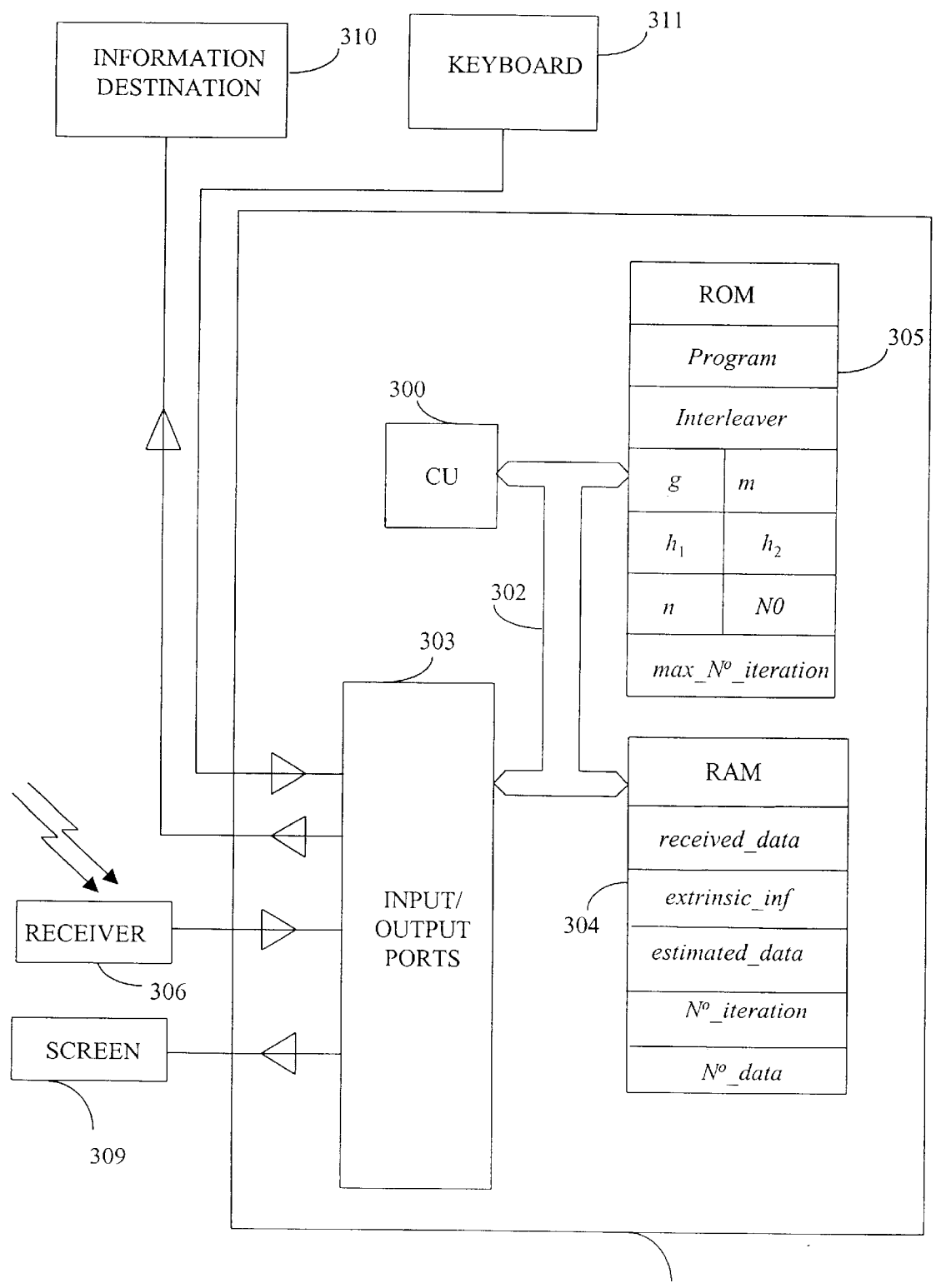
FIG. 3 depicts schematically an electronic device including a decoding device according to the present invention, in a particular embodiment.

FIG. 3 illustrates schematically the constitution of a network station or computer decoding station, in the form of a block diagram.

This station has a keyboard 311, a screen 309, an external information destination 310, and a radio receiver 306, conjointly connected to an input/output port 303 of a processing card 301.

The processing card 301 has, connected together by an address and data bus 302:

a central processing unit 300;

a random access memory RAM 304;

a read only memory ROM 305; and the input/output port 303.

Each of the elements illustrated in FIG. 3 is well known to persons skilled in the art of microcomputers and transmission systems and, more generally, information processing systems. These common elements are therefore not described here. It should, however, be noted that:

the information destination 310 is, for example, an interface peripheral, a display, a modulator, an external memory or another information processing system (not shown), and is advantageously adapted to receive sequences of signals representing speech, service messages or multimedia data, in the form of sequences of binary data, and that the radio receiver 306 is adapted to use a packet transmission protocol on a wireless channel, and to receive these packets over such a channel.

It should also be noted that the word "register" used in the description designates, in each of the memories 304 and 305, both a memory area of low capacity (a few binary data) and a memory area of large capacity (making it possible to store an entire program).

Figure 4:
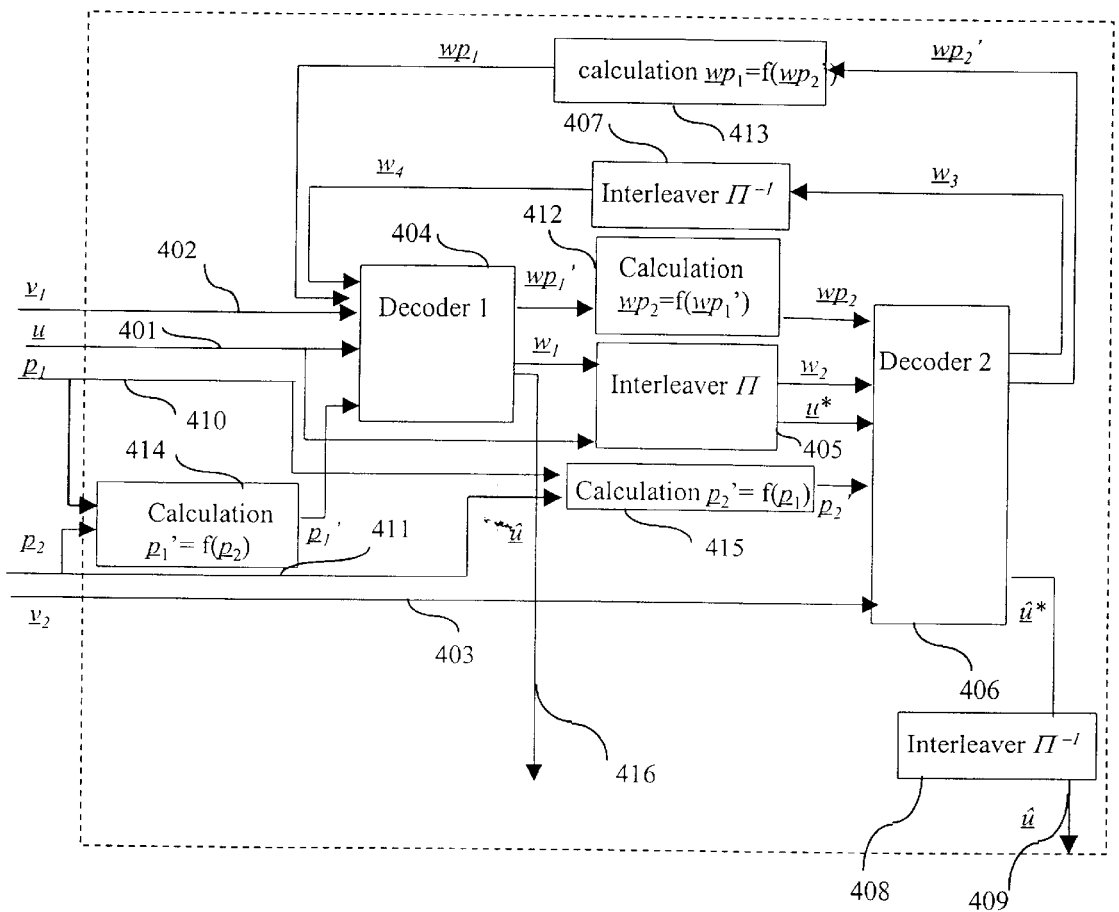
FIG. 4 depicts schematically, in the form of a block diagram, a decoding device corresponding to a parallel convolutional turbocode, according to the present invention, in a particular embodiment.

The random access memory 304 stores data, variables and intermediate processing results, in memory registers bearing, in the description, the same names as the data whose values they store. The random access memory 304 contains notably:

a register "received_data", in which there is stored, in the order of arrival of the binary data over the bus 302 coming from the transmission channel, a soft estimation of these binary data, equivalent to a measurement of reliability, in the form of a sequence, a register "extrinsic_inf", in which there is stored, at a given moment, the extrinsic and a priori information corresponding to the sequences U, $p_1$ and $p_2$, a register "estimated_data", in which there is stored, at a given moment, an estimated sequence û supplied as an output by the decoding device of the invention, as described below with the help of FIG. 4, a register "N°_iteration", which stores an integer number corresponding to a counter of iterations effected by the decoding device concerning a received sequence u, as described below with the help of FIG. 4, and a register "N°_data", which stores an integer number corresponding to the number of binary data in the register "received_data".

The read only memory 305 is adapted to store, in registers which, for convenience, have the same names as the data which they store:

the operating program of the central processing unit 300, in a register "Program", the sequence g, in a register "g", the degree m of g(x), in a register "m", the sequence $h_1$, in a register "$h_1$", the sequence $h_2$, in a register "$h_2$", the value of N0, in a register "N0", the value of n, in a register "n", and the array defining the interleaver and its reverse interleaver, in a register "Interleaver".

The data in ROM 305 can be provided by a removable storage medium, such as, for example, a floppy disk, a CD-ROM or a DVD.

Figure 6:
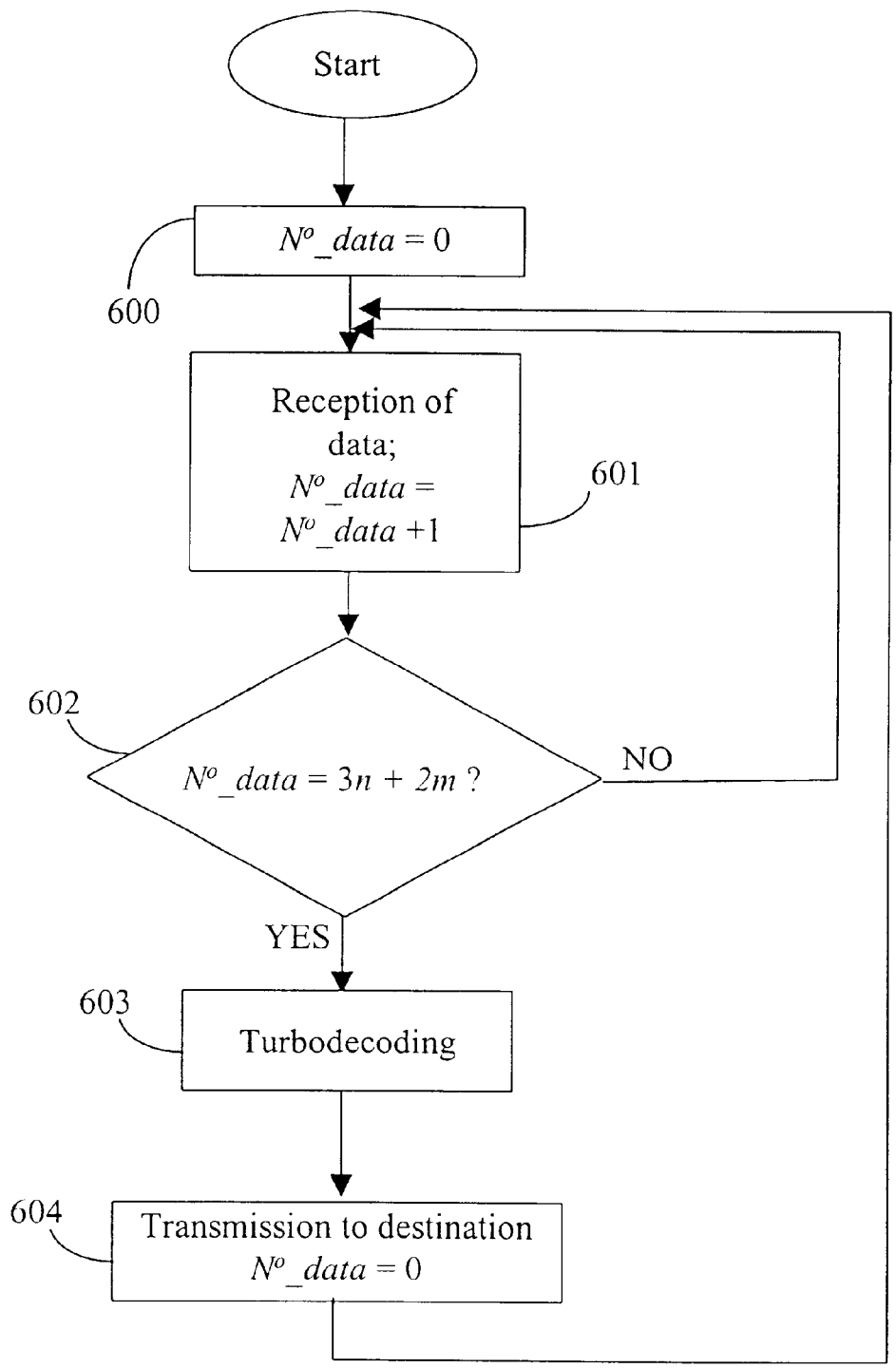
FIG. 6 is a flow diagram depicting schematically decoding operations implemented by a decoding device such as the one included in the electronic device of FIG. 3, in accordance with the present invention, in a particular embodiment.

The central processing unit 300 is adapted to implement the flow diagram illustrated in FIG. 6.

In FIG. 4, it can be seen that a decoding device has notably:

five inputs 401, 402, 403, 410 and 411 of sequences representing u, $v_1$, $v_2$, $p_1$ and $p_2$, which, for convenience, are also denoted u, $v_1$, $v_2$, $p_1$ and $p_2$, the received sequence, consisting of these five sequences, being denoted r;

a first soft input output decoder 404 corresponding to the encoder 202 (FIG. 2):

The first decoder 404 receives as an input:

the sequences u and $v_1$, a sequence $p'_1$ defined below, and two a priori information sequences $w_4$ and $wp_1$ described below.

The first decoder 404 supplies as an output:

two extrinsic information sequences $w_1$ and $wp_1'$, and an estimated sequence û at an output 416.

The decoding device illustrated in FIG. 4 also has:

an interleaver 405 (denoted "Interleaver Π" in FIG. 4), based on the same permutation as the one defined by the interleaver 203 used in the encoding device; the interleaver 405 receives as an input the sequences u and $w_1$ and interleaves them respectively in two sequences u* and $w_2$;

an operation unit 412, which determines a priori information $wp_2$ from the extrinsic information $wp_1'$;

a second soft input output decoder 406, corresponding to the encoder 204.

This second decoder 406 receives as an input:

the sequences $w_2$, $wp_2$, $p'_2$, u* and $v_2$.

The second decoder 406 supplies as an output:

two extrinsic information sequences $w_3$ and $wp_2'$, and an estimated sequence û*.

The decoding device illustrated in FIG. 4 also has:

a deinterleaver 408 (denoted "Interleaver $\Pi^{-1}$" in FIG. 4), the reverse of the interleaver 405, receiving as an input the sequence û* and supplying as an output an estimated sequence û, at an output 409 (this estimation being improved compared with the one supplied, a half-iteration previously, at the output 416);

a deinterleaver 407 (also denoted "Interleaver $\Pi^{-1}$" in FIG. 4), the reverse of the interleaver 405, receiving as an input the extrinsic information sequence $w_3$ and supplying as an output the a priori information sequence $w_4$;

an operation unit 414, which determines a sequence $p'_1$ from the sequences $p_1$ and $p_2$;

an operation unit 415, which determines a sequence $p'_2$ from the sequences $p_1$ and $p_2$;

an operation unit 413, which determines a priori information $wp_1$ from the extrinsic information $wp_2'$; and the output 409, to which the decoding device supplies the estimated sequence û, as the output of the deinterleaver 408.

Account is taken of an estimated sequence û only following a predetermined number of iterations (see the article "Near Shannon limit error-correcting coding and decoding: turbocodes" referred to above).

In the preferred embodiment described here, in initializing the decoders 404 and 406 account is taken of the fact that the encoders 202 and 204 each have null initial and final states.

In FIG. 5, which depicts the functioning of an encoding device such as the one included in the electronic device illustrated in FIG. 1, it can be seen that, after an initialization operation 500, during which the registers of the random access memory 104 are initialised (N°_data="0"), during an operation 501, the central unit 100 waits until it receives, and then receives a binary data item to be transmitted, positions it in the random access memory 104, in the register "source_data", and increments the counter "N°_data" by one unit.

Next, during a test 502, the central unit 100 determines whether or not the integer number stored in the register "N°_data" is equal to n (the value stored in the read only memory 105).

When the result of the test 502 is negative, the operation 501 is reiterated.

When the result of the test 502 is positive, during an operation 508, the first encoder 202 (see FIG. 2) simultaneously determines the padding sequence $p_1$, the division by $g(x)$ of the polynomial $a(x)$ associated with the sequence of binary data obtained by concatenating the sequences u and $p_1$ ($p_1$ being determined so that the remainder of this division is zero) and the product of the result of this division and $h_1(x)$. The sequences u, $p_1$ and the result of this operation, $v_1$, are stored in memory in the register "data_to_send".

In parallel to the operation 508, during an operation 506, the binary data in the sequence u are successively read in the register "received_data", in the order described by the array "interleaver" stored in the read only memory 105. The data which result successively from this reading are stored in memory in the register "permuted_data" in the random access memory 104.

Next, during an operation 510, the second coder 204 simultaneously determines the padding sequence $p_2$, the division by $g(x)$ of the polynomial $b(x)$ associated with the sequence of binary data obtained by concatenating the sequences u* and $p_2$ ($p_2$ being determined so that the remainder of this division is zero) and the product of the result of this division by $h_2(x)$. The sequence $p_2$ and the result of this operation, $v_2$, are stored in memory in the register "data_to_send".

During an operation 509, the sequences u, $p_1$, $p_2$, $v_1$ and $v_2$ are sent using, for this purpose, the transmitter 106. Next the registers in the memory 104 are once again initialised (step 500 is returned to); in particular the counter N°_data is reset to "0". Then the operation 501 is reiterated.

In a variant, during the operation 509, the sequences u, $v_1$, $v_2$, $p_1$ and $p_2$ are not sent in their entirety but only a sub-set thereof. This variant is known to persons skilled in the art as puncturing. Normally, the padded bits are not punctured. Here, by virtue of the interleaver preserving divisibility by $g(x)$, it is possible to establish relationships between the padding bits; thus it is possible to puncture a certain number of padding bits and to send only a sub-set of these bits. Advantageously, only a set of padding bits which are linearly independent, but which remains representative of the sequences $p_1$ and $p_2$, will be sent. In other words, solely knowledge of the padding bits sent is necessary and sufficient for reconstituting all the sequences $p_1$ and $p_2$.

In FIG. 6, which depicts the functioning of a decoding device such as the one included in the electronic device illustrated in FIG. 3, it can be seen that, after an initialisation operation 600, during which the registers of the random access memory 304 are initialised (N°_data="0"), during an operation 601, the central unit 300 waits until it receives, and then receives, a data item in soft form corresponding to a measurement of reliability of a data item sent by the transmitter 106 and received by the receiver 306, positions it in the random access memory 304, in the register "received_ data" and increments the counter "N°_data" by one unit.

Next, during a test 602, the central unit 300 determines whether or not the integer number stored in the register "N°_data" is equal to 3n+2m (n and m being values stored in the read only memory 305), 3n+2m being the total number of binary data sent by the transmitter 106.

When the result of the test 602 is negative, the operation 601 is reiterated.

When the result of the test 602 is positive, during a turbodecoding operation 603, detailed below, the decoding device gives an estimation û of the transmitted sequence u.

Then, during an operation 604, the central unit 300 supplies this estimation û to the information destination 310.

Next the registers in the memory 304 are once again initialised. In particular, the counter N°_data is reset to "0" and operation 601 is reiterated.

Figure 7:
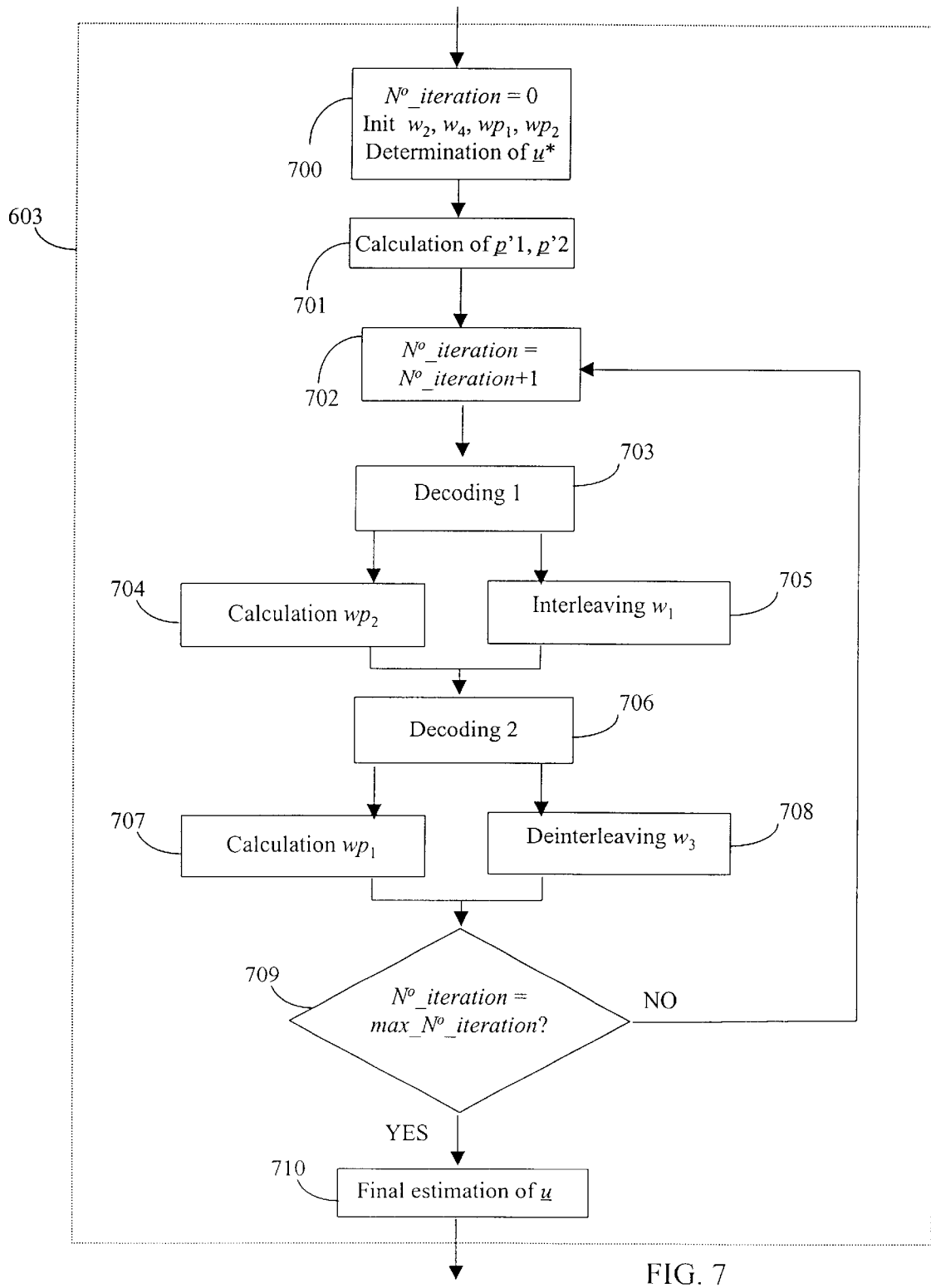
FIG. 7 is a flow diagram depicting schematically a turbodecoding operation included in the flow diagram of FIG. 6, in a particular embodiment of the present invention.

In FIG. 7, which details the turbodecoding operation 603, it can be seen that, during an initialization operation 700, the registers in the random access memory 304 are initialised: the counter N°_data and the a priori information $w_2$, $w_4$, $wp_1$ and $wp_2$ are reset to zero (it is assumed here that the entropy of the source is zero). In addition, the interleaver 405 interleaves the input sequence u and supplies a sequence u* which is stored in the register received_data.

Then, during an operation 701, the operation units 414 and 415 respectively calculate the sequences $p'_1$ and $p'_2$ from the sequences $p_2$ and $p_1$ and store them in the register received_data.

Next, during an operation 702, the register N°_iteration is incremented by one unit.

Then, during an operation 703, the first decoder 404 (corresponding to the first elementary encoder 202) implements an algorithm of the "Soft Input Soft Output" (SISO) type, well known to persons skilled in the art, such as the BJCR mentioned above, or the SOVA ("Soft Output Viterbi Algorithm"), as follows: taking into account null initial and final states of the encoder, the first decoder 404 considers, as soft inputs, an estimation of the received sequences u and $v_1$, of the sequence $p'_1$ and of $wp_1$ and $w_4$ (respectively a priori information on $p_1$ and u) and supplies, on the one hand, $wp_1'$ and $w_1$ (respectively extrinsic information on $p_1$ and u) and, on the other hand, an estimation û of the sequence u.

For fuller details on the decoding algorithms used in the turbocodes, reference can be made to:
  the article by L. R. Bahl, J. Cocke, F. Jelinek and J. Raviv entitled *"Optimal decoding of linear codes for minimizing symbol error rate"*, in IEEE Transactions on Information Theory, March 1974, which describes a so-called "BJCR" algorithm generally used in relation to turbocodes; or
  the article by J. Hagenauer and P. Hoeher entitled *"A Viterbi algorithm with soft decision outputs and its applications"*, published with the proceedings of the IEEE GLOBECOM conference, pages 1680–1686, in November 1989.

During an operation 705, the interleaver 405 interleaves the sequence $w_1$ in order to produce $w_2$, a priori information on u*.

In parallel, during an operation 704, the operation unit 412 calculates the sequence $wp_2$ from the sequence $wp_1'$.

Next, during an operation 706, the second decoder 406 (corresponding to the second elementary encoder 204) uses an algorithm of the soft input soft output type, as follows: taking into account null initial and final states of the encoder, the second decoder 406 considers as soft inputs an estimation of the received sequences u* and $v_2$, of the sequence $p'_2$ and of $wp_2$ and $w_2$ (respectively a priori information on $p_2$ and u) and supplies, on the one hand, $wp_2'$ and $w_3$ (respectively extrinsic information on $p_2$ and u*) and, on the other hand, an estimation û of the sequence u*.

During an operation 708, the deinterleaver 407 (the reverse interleaver of 405) deinterleaves the information sequence $w_3$ in order to produce $w_4$, a priori information on u.

In parallel, during an operation 707, the operation unit 413 calculates the sequence $wp_1$ from the sequence $wp_2'$.

The extrinsic and a priori information produced during steps 703, 704, 706 and 707 is stored in the register "extrinsic_inf" in the RAM 304.

Next, during a test 709, the central unit 300 determines whether or not the integer number stored in the register "N°_iteration" is equal to a maximum predetermined number of iterations to be effected, stored in the register "max_ N°_iteration" of the ROM 305.

When the result of test 709 is negative, operation 702 is reiterated.

When the result of test 709 is positive, during an operation 710, the deinterleaver 408 (identical to the deinterleaver 407) deinterleaves the sequence û*, in order to supply a deinterleaved sequence to the central unit 300, which then transforms the soft decision into a hard decision, in the form of a sequence û, estimate of u.

The calculation operations 701, 704 and 707, which are, within the decoding device, specific to the invention, are now detailed.

For this purpose, the example given in the detailed description of the encoding device will be taken up again and the corresponding decoding device considered.

It has been seen that, in the aforementioned example, the padding bits are linked by one of the following two equivalent equation systems:

$$p_{20}=p_{10}+p_{11}$$

$$p_{21}=p_{11}+p_{12}$$

$$p_{22}=p_{11} \qquad (1)$$

$$p_{10}=p_{20}+p_{22}$$

$$p_{12}=p_{22}+p_{21}$$

$$p_{11}=p_{22} \qquad (2)$$

These relationships can be predetermined according to the method described above with regard to the paragraph describing the relationships between the padding bits.

On the decoding device side, there are only estimations of $p_1$ and $p_2$, and the decoders 404 and 406 will take advantage of both $p_2$ and $p_1$.

Thus the decoder 404 will not directly take the information which it has on $p_1$ or $p_2$ but will use $p'_1$.

Likewise, the decoder 406 will not directly take the information which it has on $p_1$ or $p_2$ but will use $p'_2$.

The operation units 413 and 414 use the system (2), which can be calculated instantly or, preferably, stored in memory in the form of a conversion table, in order to determine respectively $wp_1$ from $wp_2'$ and $p'_1$ from $p_1$ and $p_2$. Nevertheless, it should be noted that $wp_1$, $wp_2'$, $p_2$ and $p'_1$ are soft information and correspond generally to likelihood ratio logarithms. Thus care will be taken to effect the additions of soft information in accordance with methods which are not trivial but well known to persons skilled in the art of decoders. Reference can be made, for example, to the section "Likelihood algebra of a binary random variable" in the article entitled *"Source controlled channel decoding"* by J. Hagenauer, in IEEE Transactions on Communications, Vol. 43, No. 9, September 1995.

Likewise, the operation units 412 and 415 use the system (1), which can be calculated instantly or, preferably, stored in memory in the form of a conversion table, in order to determine respectively $wp_2$ from $wp_1'$ and $p'_2$ from $p_1$ and $p_2$.

As a variant, when padding bits have been punctured during the encoding operation, the soft inputs of these bits will be initialised to a zero value. If the sequence $p_1$ has been completely punctured, the input $p'_2$ of the second decoder 406 will be identical to $p_2$. Conversely, if the sequence $p_2$ has been completely punctured, the input $p'_1$ of the first decoder 404 will be identical to $p_1$.

In another variant, which is more general, the invention is not limited to the turbo-encoders composed of two encoders or to the turbo-encoders with one input: it can apply to turbo-encoders composed of several elementary encoders or to turbo-encoders with several inputs, such as those described in the report by D. Divsalar and F. Pollara mentioned in the introduction.

It will be ensured in this case that the interleavers used preserve divisibility by the generator polynomial or polynomials used and that the elementary encoders are initialised to the zero state and return to zero by virtue of the padding bits, the latter not being interleaved. It will then possible to establish the relationships which link these padding bits and use them in the decoding device in a similar manner to that which was disclosed above.

Figure 8:
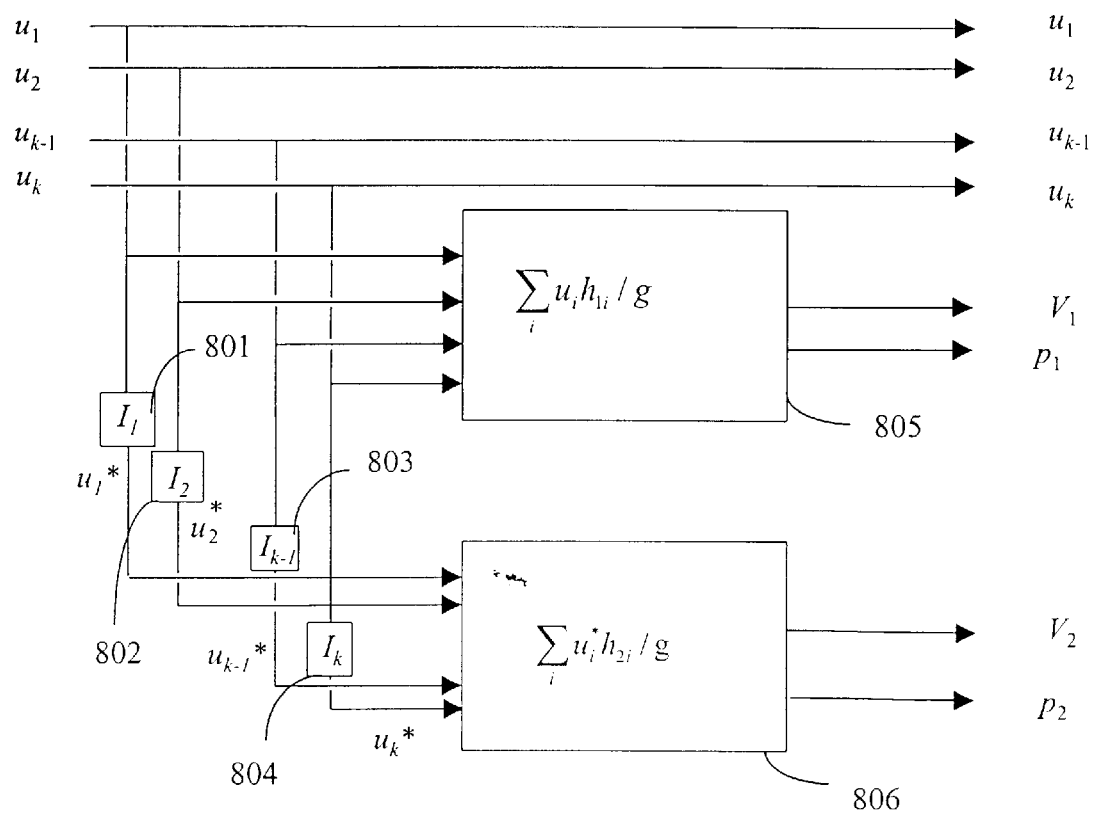
FIG. 8 depicts schematically an encoding device corresponding to a convolutional turbocode including several inputs, according to a variant embodiment of the present invention.

Thus, FIG. 8 describes an encoding device having a turbo-encoder with several inputs $u_1, u_2, \ldots, u_{k-1}, u_k$ according to the invention.

The interleavers $l_1, l_2, \ldots, l_{k-1}, l_k$, designated by the reference numbers 801 to 804, preserve divisibility by the feedback polynomial $g(x)$ used in the encoders 805 and 806.

The padding sequences $p_1$ and $p_2$ are not interleaved.

The corresponding decoding device can easily be derived from the description of the encoding device, on the basis of the description of the decoding device given previously in cases where a single input and a single interleaver are considered.

What is claimed is:

1. Method for encoding at least one sequence of original binary data, according to which:
    at least one first padding operation is performed, comprising supplementing the original sequence with a first sequence of padding binary data chosen so that the original sequence, supplemented by said first padding sequence, is divisible by a first divisor polynomial;
    at least one first recursive convolutional encoding operation is performed, comprising encoding the original sequence, supplemented by the first padding sequence, by means of an encoding technique using said first divisor polynomial;
    at least one interleaving operation is performed, comprising permuting the binary data of the original sequence by means of a specific permutation, so as to obtain an interleaved sequence;

said coding method being characterized in that:
    said specific permutation is, in a representation where the binary data of the original sequence are written and read, row by row, in an array with N0 columns and M rows, where N0 is the smallest integer such that the first divisor polynomial divides the polynomial $x^{N0}+1$ and M is a positive integer, the resultant:
    of an intercolumn permutation which transforms the cyclic code of length N0 whose generator polynomial is said first divisor polynomial into a cyclic code whose generator polynomial is a second divisor polynomial, said intercolumn permutation permuting with each other the N0 columns of the array representing the original sequence, and
    any number of intracolumn elementary permutations, each of said elementary permutations being any permutation of the symbols in a column of said array; and
    in that:
    at least one second padding operation is performed, comprising supplementing the interleaved sequence with a second sequence of padding binary data, chosen so that the interleaved sequence, supplemented by the second padding sequence, is divisible by said second divisor polynomial; and
    at least one second recursive convolutional coding operation is performed, comprising coding the interleaved sequence, supplemented by said second padding sequence, by means of an encoding technique using the second divisor polynomial.

2. Encoding method according to claim 1, characterized in that the binary data in the second padding sequence are determined solely from the knowledge of the binary data in the first padding sequence.

3. Encoding method according to claim 2, characterized in that the binary data in the second padding sequence are determined from a previously established conversion table giving the second padding sequence as a function of the first padding sequence.

4. Encoding method according to claim 2, characterized in that the binary data in the second padding sequence are determined instantly as a function of the binary data in the first padding sequence.

5. Encoding method according to any one of claims 1 to 4, characterized in that, in order to construct said second padding sequence from said first padding sequence having a number of data equal to the degree of the first divisor polynomial:
    the first padding sequence is supplemented with zeros, so as to obtain a sequence with a length equal to N0;
    the binary data in the first padding sequence are permuted by means of said intercolumn permutation, so as to obtain a first interleaved padding sequence;
    the residue of the polynomial division of the first interleaved padding sequence by the second divisor polynomial is determined; and
    said residue is chosen as the second padding sequence.

6. Encoding method according to any one of claims 1 to 4, characterized in that the first divisor polynomial and the second divisor polynomial are identical.

7. Encoding method according to claim 6, characterized in that, when said intercolumn permutation is the identity permutation, the second padding sequence is determined as being equal to the first padding sequence.

8. Encoding method according to any one of claims 1 to 4, characterized in that at least one of the padding sequences is punctured.

9. Encoding method according to claim 8, characterized in that at least one of the padding sequences is punctured so that the encoded sequence includes a part of the first and second padding sequences which remains representative of all the first and second padding sequences.

10. Encoding method according to claim 8, characterized in that the first padding sequence is punctured in its entirety.

11. Encoding method according to claim 8, characterized in that the second padding sequence is punctured in its entirety.

12. Method for decoding at least one original symbol sequence, characterized in that the original symbol sequence represents a binary sequence encoded by means of an encoding method according to any one of claims 1 to 4.

13. Decoding method according to claim 12, characterized in that it implements soft input soft output decoding operations.

14. Decoding method according to claim 12, characterized in that there is effected iteratively:
at least one first elementary operation of decoding a recursive convolutional code, comprising decoding a first sub-sequence of said original symbol sequence by means of a decoding technique using the first divisor polynomial and taking at least into account a first binary data sequence which is a function of the first and second padding sequences.

15. Decoding method according to claim 14, characterized in that said first binary data sequence is determined from a previously established system of equations giving the first binary data sequence as a function of the first and second padding sequences.

16. Decoding method according to claim 14, characterized in that said first sequence of binary data is determined from a system of equations established instantly and giving the first binary data sequence as a function of the first and second padding sequences.

17. Decoding method according to claim 14, the second padding sequence having been fully punctured at the time of encoding, characterized in that the first sequence of binary data taken into account during the first elementary decoding operation is identical to the first padding sequence.

18. Decoding method according to claim 12, characterized in that there is also effected iteratively:
at least one second elementary operation of decoding a recursive convolutional code, comprising decoding a second sub-sequence of said original symbol sequence by means of a decoding technique using the second divisor polynomial and taking at least into account a second binary data sequence which is a function of the first and second padding sequences.

19. Decoding method according to claim 18, characterized in that said second binary data sequence is determined from a previously established system of equations giving the second binary data sequence as a function of the first and second padding sequences.

20. Decoding method according to claim 18, characterized in that said second binary data sequence is determined from a system of equations established instantly and giving the second binary data sequence as a function of the first and second padding sequences.

21. Decoding method according to claim 18, the first padding sequence having been fully punctured at the time of encoding, characterized in that the second binary data sequence taken into account during the second elementary decoding operation is identical to the second padding sequence.

22. Decoding method according to claim 12, characterized in that there is also effected iteratively:
at least one operation of interleaving a sequence representing the original sequence and in that:
during the first elementary decoding operation, at least one first extrinsic information sequence is determined, and
in parallel to the interleaving operation, a first calculation operation is effected, comprising calculating a first a priori information sequence as a function of said first extrinsic information sequence, said first a priori information sequence being taken into account during the second elementary decoding operation.

23. Decoding method according to claim 22, characterized in that the first a priori information sequence is determined from a previously established system of equations giving the first a priori information system as a function of the first extrinsic information sequence.

24. Decoding method according to claim 22, characterized in that the first a priori information sequence is determined from a system of equations established instantly giving the first a priori information sequence as a function of the first extrinsic information sequence.

25. Decoding method according to claim 12, characterized in that there is also effected iteratively:
at least one operation of deinterleaving a sequence representing the original interleaved sequence and in that:
during the second elementary decoding operation, at least one second extrinsic information sequence is determined, and
in parallel to the interleaving operation, a second calculation operation is effected, comprising calculating a second a priori information sequence as a function of said second extrinsic information sequence, said second a priori information sequence being taken into account during the first elementary decoding operation.

26. Decoding method according to claim 25, characterized in that the second a priori information sequence is determined from a previously established system of equations giving the second a priori information sequence as a function of the second extrinsic information sequence.

27. Decoding method according to claim 25, characterized in that the second a priori information sequence is determined from a system of equations established instantly giving the second a priori information sequence as a function of the second extrinsic information sequence.

28. An information storage medium, which can be read by a computer or microprocessor, storing instructions codes of a computer program, wherein said computer program, when read by said computer or microprocessor, comprises the instruction codes permitting the computer the perform decoding method according to claim 12.

29. An information storage medium according to claim 28, wherein said information storage medium is removable, partially or totally.

30. An information storage medium, which can be read by a computer or microprocessor, storing instructions codes of a computer program, wherein said computer program, when read by said computer or microprocessor, comprises the instruction codes permitting the computer to perform an encoding method according to any one of claims 1 to 4.

31. An information storage medium according to claim 30, wherein said information storage medium is removable, partially or totally.

32. Device for encoding at least one sequence of original binary data, having:
at least first padding means, for supplementing the original sequence with a first sequence of padding binary data chosen so that the original sequence, supplemented by said first padding sequence, is divisible by a first divisor polynomial;

at least first recursive convolutional encoding means, for encoding the original sequence, supplemented by the first padding sequence, by means of an encoding technique using said first divisor polynomial;

at least first interleaving means, for permuting the binary data in the original sequence by means of a specific permutation, so as to obtain an interleaved sequence;

said encoding device being characterized in that:

said specific permutation is, in a representation where the binary data in the original sequence are written and read, row by row, in an array with N0 columns and M rows, where N0 is the smallest integer such that the first divisor polynomial divides the polynomial $x^{N0}+1$ and M is a positive integer, the resultant:

of an intercolumn permutation which transforms the cyclic code of length N0 whose generator polynomial is said first divisor polynomial into a cyclic code whose generator polynomial is a second divisor polynomial, said intercolumn permutation permuting with each other the N0 columns of the array representing the original sequence, and any number of intracolumn elementary permutations, each of said elementary permutations being any permutation of the symbols in a column of said array; and in that the device also has:

at least second padding means, for supplementing the interleaved sequence with a second sequence of padding binary data, chosen so that the interleaved sequence, supplemented by the second padding sequence, is divisible by said second divisor polynomial; and at least second recursive convolutional encoding means, for encoding the interleaved sequence, supplemented by said second padding sequence, by means of an encoding technique using the second divisor polynomial.

33. Encoding device according to claim 32, characterized in that said second padding means determine the binary data in the second padding sequence solely from knowledge of the binary data in the first padding sequence.

34. Encoding device according to claim 33, characterized in that said second padding means determine the binary data in the second padding sequence from a previously established conversion table giving the second padding sequence as a function of the first padding sequence.

35. Encoding device according to claim 33, characterized in that said second padding means determine the binary data in the second padding sequence instantly as a function of the binary data in the first padding sequence.

36. Encoding device according to any one of claims 32 to 35, characterized in that it also has, for constructing said first and second padding sequences:

means for choosing a number of binary data in the first padding sequence equal to the degree of the first divisor polynomial;

means for supplementing the first padding sequence with zeros, so as to obtain a sequence with a length equal to N0;

means for permuting the binary data in the first padding sequence using said intercolumn permutation, so as to obtain a first interleaved padding sequence;

means for determining the residue of the polynomial division of the first interleaved padding sequence by the second divisor polynomial; and means for choosing said residue as the second padding sequence.

37. Encoding device according to any one of claims 32 to 35, characterized in that the first divisor polynomial and the second divisor polynomial are identical.

38. Encoding device according to claim 37, characterized in that, when said intercolumn permutation is the identity permutation, the second padding sequence is determined as being equal to the first padding sequence.

39. Encoding device according to any one of claims 32 to 35, characterized in that it also has puncturing means for puncturing at least one of the padding sequences.

40. Encoding device according to claim 39, characterized in that said puncturing means puncture the first padding sequence in its entirety.

41. Encoding device according to claim 39, characterized in that said puncturing means puncture at least one of the padding sequences so that the encoded sequence includes a part of the first and second padding sequences which remains representative of all the first and second padding sequences.

42. Encoding device according to claim 39, characterized in that said puncturing means puncture the second padding sequence in its entirety.

43. Device for decoding at least one original symbol sequence, characterized in that the original symbol sequence represents a binary sequence encoded by means of an encoding device according to any one of claims 32 to 35.

44. Decoding device according to claim 43, characterized in that it uses soft input soft output decoding means.

45. Decoding device according to claim 43, characterized in that it has:

at least first elementary means of decoding a recursive convolutional code, operating iteratively, for decoding a first subsequence of said original symbol sequence by means of a decoding technique using the first divisor polynomial and taking at least into account a first binary data sequence which is a function of the first and second padding sequences.

46. Decoding device according to claim 45, characterized in that it also has means for determining said first binary data sequence from a previously established system of equations giving the first binary data sequence as a function of the first and second padding sequences.

47. Decoding device according to claim 45, characterized in that it also has means for determining said first binary data sequence from a system of equations established instantly and giving the first binary data sequence as a function of the first and second padding sequences.

48. Decoding device according to claim 45, the second padding sequence having been fully punctured during encoding, characterized in that the first binary data sequence taken into account by the first elementary decoding means is identical to the first padding sequence.

49. Decoding device according to claim 43, characterized in that it also has:

at least second elementary means of decoding a recursive convolutional code, operating iteratively, in order to decode a second subsequence of said original symbol sequence by means of a decoding technique using the second divisor polynomial and taking at least into account a second binary data sequence which is a function of the first and second padding sequences.

50. Decoding device according to claim 49, characterized in that it also has means for determining said second binary data sequence using a previously established system of equations giving the second binary data sequence as a function of the first and second padding sequences.

51. Decoding device according to claim 49, characterized in that it also has means for determining said second binary data sequence using a system of equations established instantly and giving the second binary data sequence as a function of the first and second padding sequences.

52. Decoding device according to claim 49, the first sequence having been fully punctured at the time of encoding, characterized in that the second binary data sequence taken into account by the second elementary decoding means is identical to the second padding sequence.

53. Decoding device according to claim 43, characterized in that it also has:
at least one means of interleaving a sequence representing the original sequence, operating iteratively; in that:
said first elementary decoding means output at least one first extrinsic information sequence, and in that said device also has:
first calculation means, for calculating, in parallel with said interleaving means, a first a priori information sequence as a function of said first extrinsic information sequence, said first a priori information sequence being taken into account by said second elementary decoding means.

54. Decoding device according to claim 53, characterized in that it also has means for determining the first a priori information sequence using a previously established system of equations giving the first a priori information sequence as a function of the first extrinsic information sequence.

55. Decoding device according to claim 53, characterized in that it also has means for determining the first a priori information sequence using a system of equations established instantly and giving the first a priori information sequence as a function of the first extrinsic information sequence.

56. Decoding device according to claim 43, characterized in that it also has:
at least one means of deinterleaving a sequence representing the original interleaved sequence, operating iteratively;
in that:
said second elementary decoding means output at least one second extrinsic information sequence, and in that said device also has:
second calculation means, for calculating, in parallel with said deinterleaving means, a second a priori information sequence as a function of said second extrinsic information sequence, said second a priori information sequence being taken into account by said first elementary decoding means.

57. Decoding device according to claim 56, characterized in that it also has means for determining the second a priori information sequence from a previously established system of equations giving the second a priori information sequence as a function of the second extrinsic information sequence.

58. Decoding device according to claim 56, characterized in that it also has means for determining the second a priori information sequence using a system of equations established instantly and giving the second a priori information sequence as a function of the second extrinsic information sequence.

59. Digital signal processing apparatus, characterized in that it has a decoding device according to claim 43.

60. Telecommunication network, characterized in that it has a decoding device according to claim 43.

61. Mobile station in a telecommunication network, characterized in that it has a decoding device according to claim 43.

62. Device for processing signals representing speech, characterized in that it has an encoding device according to claim 43.

63. Data transmission device having a transmitter adapted to use a packet transmission protocol, characterized in that it has an encoding device according to claim 43.

64. Digital signal processing apparatus, characterized in that it has an encoding device according to any one of claims 32 to 35.

65. Telecommunication network, characterized in that it has an encoding device according to any one of claims 32 to 35.

66. Mobile station in a telecommunication network, characterized in that it has an encoding device according to any one of claims 32 to 35.

67. Device for processing signals representing speech, characterized in that it has an encoding device according to any one of claims 32 to 35.

68. Data transmission device having a transmitter adapted to use a packet transmission protocol, characterized in that it has an encoding device according to, any one of claims 32 to 35.

69. Data transmission device according to claim 68, characterized in that said protocol is of the ATM type.

70. Data tramsmission device according to claim 68, characterized in that said protocol is of the IP type.

71. Method for encoding an original sequence of binary data comprising the steps of:
padding the original sequence with a first padding sequence of binary data so that the original sequence supplemented by the first padding sequence is divisible by a divisor polynomial;
performing a first recursive convolutional encoding on the original sequence supplemented by the first padding sequence by using the divisor polynomial;
interleaving the original sequence so as to obtain an interleaved sequence, the interleaving being performed while maintaining divisibility by the divisor polynomial;
determining a second padding sequence of binary data from the first padding sequence so that the interleaved sequence supplemented by the second padding sequence is divisible by the divisor polynomial;
padding the interleaved sequence with the second padding sequence; and
performing a second recursive convolutional encoding on the interleaved sequence supplemented by the second padding sequence by using the divisor polynomial.

72. Method according to claim 71, wherein in said determining step, the second padding sequence is determined by referring to a conversion table in which the second padding sequence is stored in correspondence with the first padding sequence.

73. Method according to claim 71, wherein in said determining step, the second padding sequence is calculated from the first padding sequence by a predetermined function.

74. A computer-readable program for controlling a computer to perform encoding of an original sequence of binary data, the program comprising codes for instructing the computer to perform a method according to claim 71.

75. An information storage medium, which can be read by a computer storing the program according to claim 74.

76. Device for encoding an original sequence of binary data comprising:

first padding means for padding the original sequence with a first padding sequence of binary data so that the original sequence supplemented by the first padding sequence is divisible by a divisor polynomial;

first encoding means for performing a first recursive convolutional encoding on the original sequence supplemented by the first padding sequence by using the divisor polynomial;

interleaving means for interleaving the original sequence so as to obtain an interleaved sequence, the interleaving being performed while maintaining divisibility by the divisor polynomial;

determining means for determining a second padding sequence of binary data from the first padding sequence so that the interleaved sequence supplemented by the second padding sequence is divisible by the divisor polynomial;

second padding means for padding the interleaved sequence with the second padding sequence; and second encoding means for performing a second recursive convolutional encoding on the interleaved sequence supplemented by the second padding sequence by using the divisor polynomial.

* * * * *

UNITED STATES PATENT AND TRADEMARK OFFICE
CERTIFICATE OF CORRECTION

PATENT NO. : 6,842,871 B2
DATED : January 11, 2005
INVENTOR(S) : Piret et al.

It is certified that error appears in the above-identified patent and that said Letters Patent is hereby corrected as shown below:

Column 9,
Line 42, "possibly" should read -- possible --.

Column 10,
Line 34, "(013)(245)" should read -- (016) (245) --.

Column 12,
Line 9, "useful" should read -- usefully --.

Column 13,
Line 46, "vof" should read -- $v_1$ of --.

Column 14,
Line 48, "sequences U," should read -- sequences u," --.

Column 16,
Line 41, "second coder" should read -- second encoder --.

Column 19,
Line 34, "possible" should read -- be possible --.

Signed and Sealed this

Twenty-eighth Day of February, 2006

JON W. DUDAS
*Director of the United States Patent and Trademark Office*